US005697173A

United States Patent [19]

McCarrick et al.

[11] Patent Number: 5,697,173

[45] Date of Patent: Dec. 16, 1997

[54] INVENTORY CONTROL COLLAR

[75] Inventors: Henry Jemison McCarrick, Fallbrook; Kevin Cochrane Ross, San Clemente; Steven Todd Ewing, Laguna Beach, all of Calif.

[73] Assignee: Span Instuments, Plano, Tex.

[21] Appl. No.: 683,774

[22] Filed: Jul. 17, 1996

[51] Int. Cl.$^6$ .............................. G09F 3/00; F16L 15/00; H05K 5/00

[52] U.S. Cl. .............................. 40/310; 40/306; 403/343; 361/730

[58] Field of Search .................................... 403/343, 288; 40/310, 306; 174/65 R; 220/378, 319; 439/620; 361/728, 730, 732, 748, 752, 683

[56] References Cited

U.S. PATENT DOCUMENTS 4,827,643 5/1989 Hearst et al. .............................. 40/306

5,555,655 9/1996 Yager et al. .............................. 40/306

*Primary Examiner*—Kenneth J. Dorner
*Assistant Examiner*—William L. Miller
*Attorney, Agent, or Firm*—Harold E. Meier

[57] ABSTRACT

An inventory control collar incorporating a resident memory for use on a cylindrical neck of a storage container comprising an electrically insulative housing having a central opening sized to fit around the cylindrical neck of the storage container, and a circumferential groove located in the top of the housing. A first conductive ring inserted into the circumferential groove in the housing is electrically connected to the first terminal of the memory and a second conductive ring inserted into the circumferential groove in the housing is electrically connected to the second terminal of the memory. An electrically insulative retainer ring is inserted into the circumferential groove between the first and second rings. Data is conducted to and from the memory by electrically contacting the first and second conductive rings.

5 Claims, 4 Drawing Sheets

INVENTORY CONTROL COLLAR

TECHNICAL FIELD

This invention relates to an inventory control collar for containers and, more particularly, to an inventory control collar incorporating a resident memory storing data.

RELATED APPLICATIONS

The present application is a component of an inventory control system including co-pending U.S. application Ser. No. 08/683,715, filed concurrently herewith; titled INVENTORY CONTROL COLLARLOCKING RING, (Attorney Docket No. 78616-266); and co-pending U.S. application Ser. No. 08/683,702, filed concurrently herewith, titled INVENTORY CONTROL PROBE AND DOCKING STATION, (Attorney Docket No. 78618-242).

BACKGROUND OF THE INVENTION

Inventory control systems manage critical information about each item in inventory in a timely and cost effective manner. Typical types of information maintained in an inventory control system include manufacturing, certification, shipping, transfer and use data. Down time and waste in manufacturing processes may be avoided with adequate, timely inventory information.

SUMMARY OF THE INVENTION

The inventory control collar of the present invention comprises a collar for placement on the neck of a container such as a gas storage cylinder. The inventory control collar is part of a total inventory control system described in one or more co-pending U.S. patent application previously recited in the Related Applications section, the disclosure of each recited application is hereby incorporated by reference.

The inventory control collar includes a resident memory that is capable of storing such general inventory control information as a collar identification number, container serial number, owner name and site, product code, product material, DOT hazard classification, content fill level, tare weight, content level during use, fill site and date, and shelf life. Typical shipping information that may be stored includes origin point (including company name, site and code), shipping manifest number, shipping date, destination point (including company name and site), destination order number and product, destination receiving date and by whom received. Typical transfer information may include the transfer point (including company name and site), manifest number, destination point (including company name and site), order number, destination receiving data and by whom received. Certification data may include record number, certifier, analysis and specification limits. Additionally, important manufacturing information such as plant upset conditions, process steps and notations may be recorded on the resident memory. Memory module data storage capabilities include 128 byte, 512 byte and 2 k byte options.

Data is written and read from the inventory control collar with an inventory control collar probe or with a collar clip attached to a control module, the subject of co-pending U.S. patent application Ser. No. 08/683,702, by concurrently touching either the probe tip or collar clip to two circumferential conductor rings exposed on the upper surface of the inventory control collar.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE INVENTION

Figure 1:
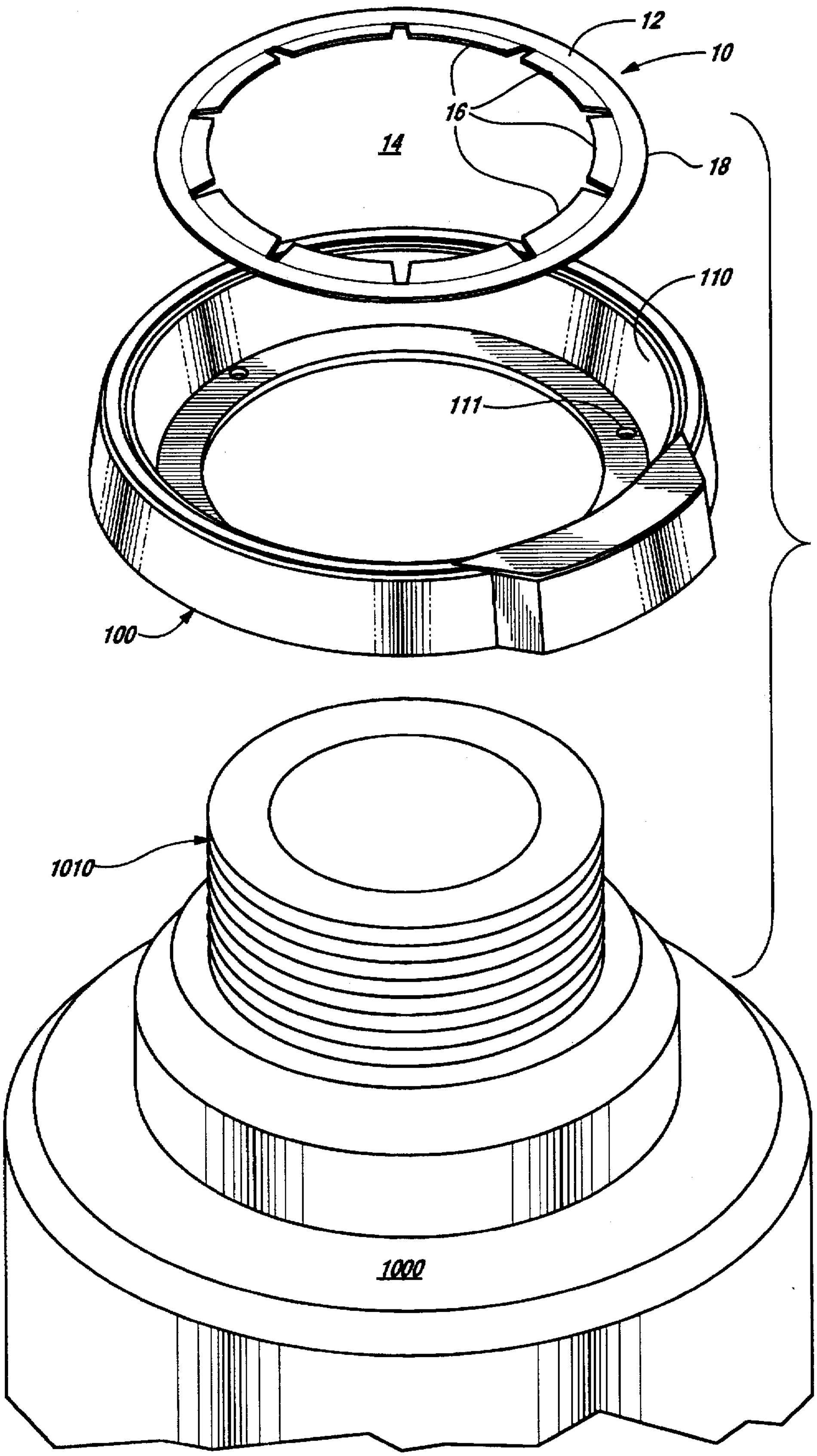
FIG. 1 is an exploded perspective view illustrating an inventory control collar of the present invention.
Figure 2:
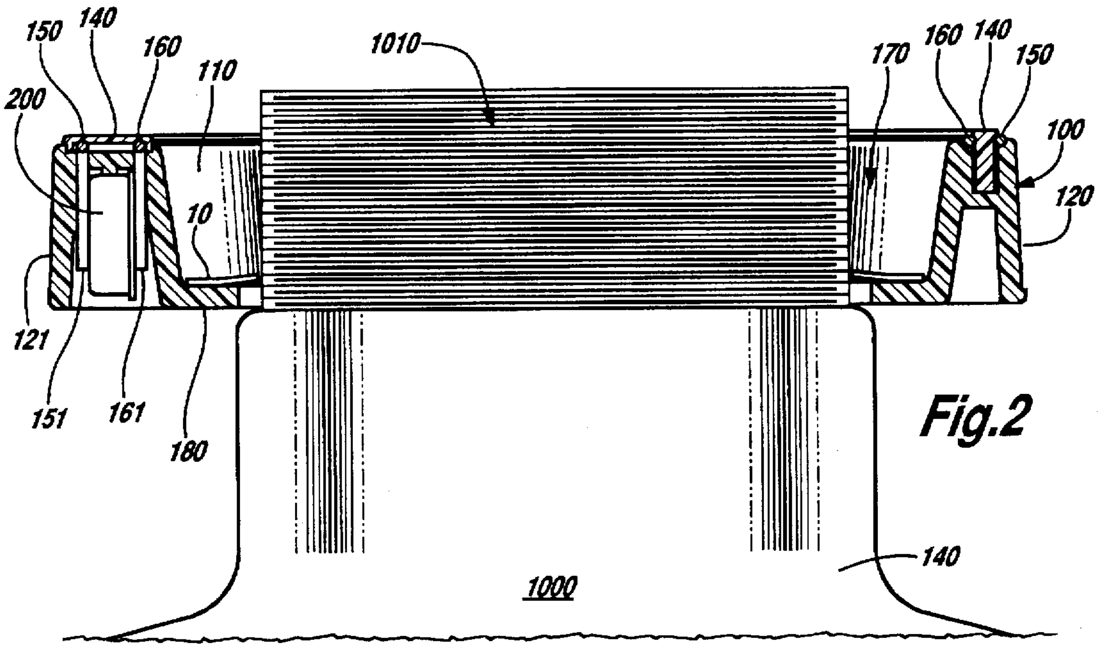
FIG. 2 is a cross section view illustrating an inventory control collar and an inventory control collar locking ring positioned around the threaded neck of a storage container.

Reference is now made to the Drawings wherein like reference characters denote like or similar parts throughout the 22 figures. Referring to FIG. 1, therein illustrated an inventory control collar locking ring 10 for securing an inventory control collar 100 around the threaded neck 1010 of a storage container 1000. Referring to FIG. 2, when in use, the inventory control collar locking ring 10 is positioned around the threaded neck 1010 of the storage container 1000 and engaging the previously installed inventory control collar 100. The locking ring 10 is sized to be received in a depression 110 in the inventory control collar 100 thereby securing the inventory control collar 100 on the storage container 1000.

Figure 9:
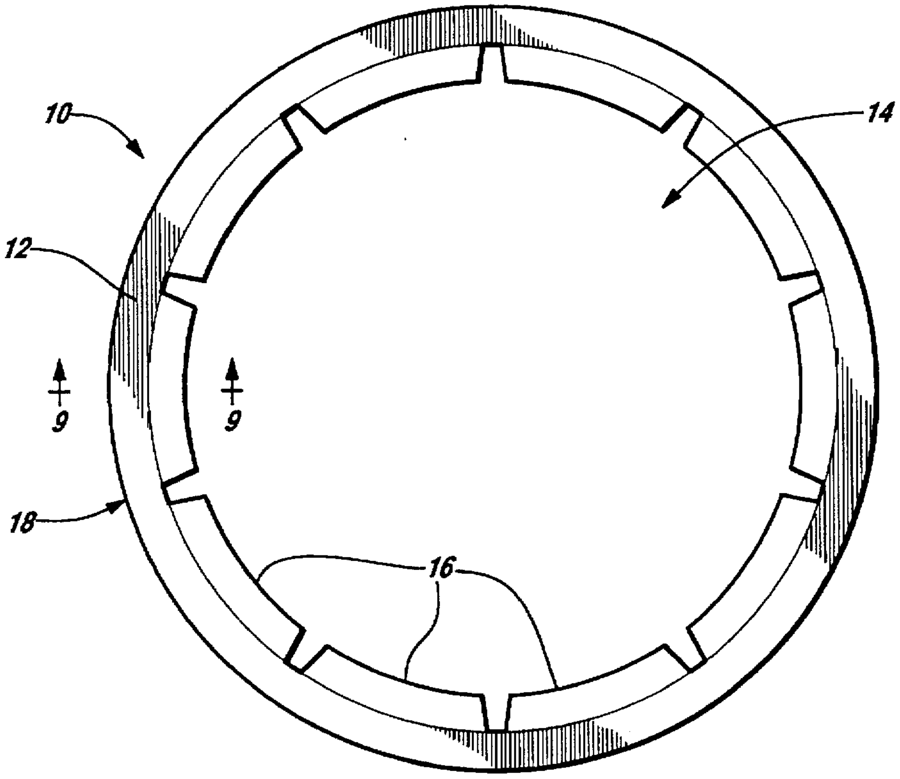
FIG. 9 is a top view of the inventory control locking ring.
Figure 10:
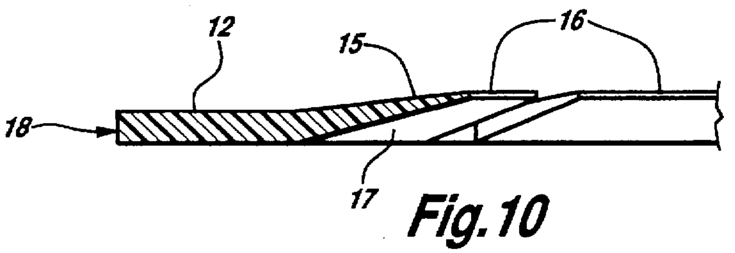
FIG. 10 is an enlarged cross section view of the inventory control ring taken along the line 9—9 of FIG. 9.

Referring now to FIGS. 1, 9 and 10, the locking ring 10 comprises a circular disc 12 with a central opening 14 sized to fit around the threaded neck 1010 of the storage container 1000 and a plurality of inwardly disposed flexible tabs 16 spaced equally around the perimeter of the central opening 14. The tabs 16 are formed integrally with the disc 12 and extend radially inward into the central opening 14, having a distance of projection sufficient to engage the threaded neck 1010 of the storage container 1000. In the preferred embodiment, the ten tabs 16 are equally spaced around the perimeter of the central opening 14. The outer perimeter 18 of the locking ring 10 is substantially the same as an inner perimeter 111 of the depression 110 of the inventory control collar 100.

As can be seen in FIG. 10, the tab 16 has an upper surface 15 angularly disposed upward from the plane of the disc 12 and an under surface 17 angularly disposed at a greater angle from the plane of the disc 12 than the upper surface 15. In the preferred embodiment, the angular displacement of the under surface 17 from the horizontal plane of the disc 12 is approximately 25 degrees. The angular disposition of the tab surfaces provide added holding power to the locking ring 10. When in an assembled state, these tabs form an interference fit with the threaded neck 1010.

Figure 3:
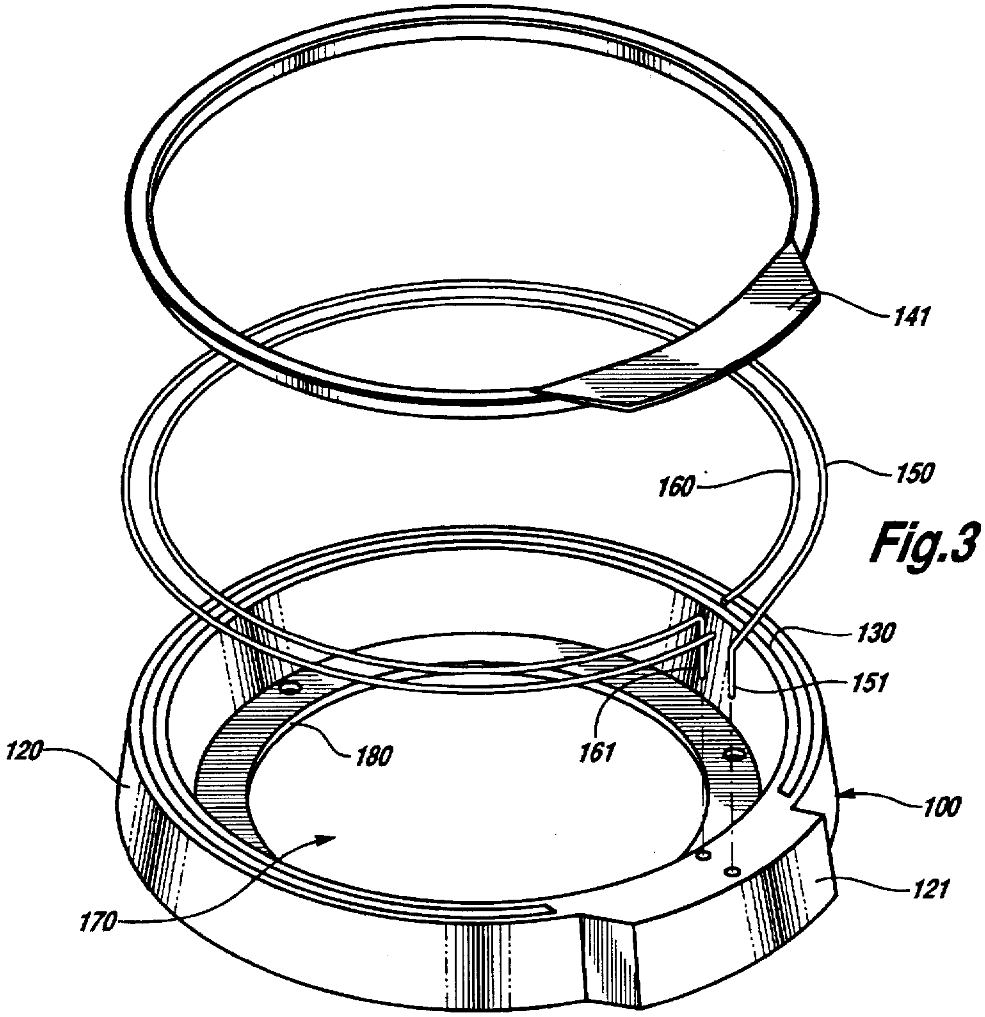
FIG. 3 is an exploded perspective view of components of the inventory control collar.
Figure 5:
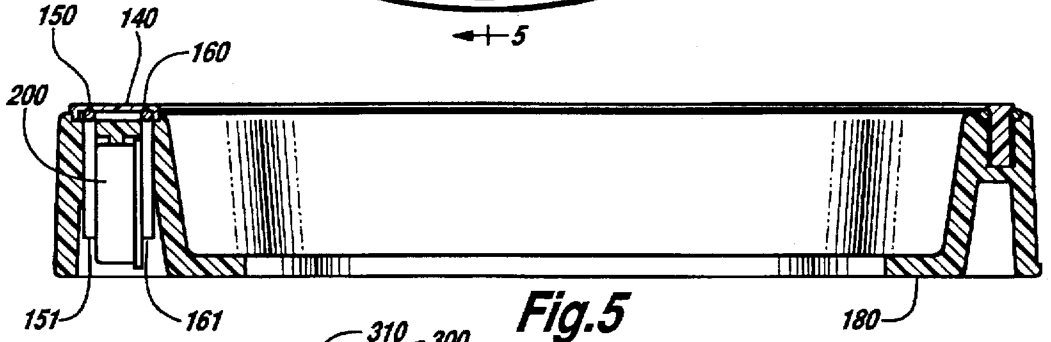
FIG. 5 is a cross section view of the inventory control collar taken along the line 5—5 of FIG. 4.

Referring to FIGS. 2 and 3, therein is shown an exploded view (FIG. 3) of the inventory control collar 100. The inventory control collar 100 includes a polymeric collar housing 120 having a truncated conal exterior shape with a nose 121 projecting from the exterior circumference. The nose 121 contains a touch memory cannister 200 (as seen in FIGS. 2 and 5). An outer first conductive ring 150 and an inner second conductive ring 160 are seated in a "T" shaped groove 130 in the top of the collar housing 120. A "T" shaped insulating retainer ring 140 is inserted from the top between the first conductive ring 150 and the second ring 160 and seats in the lower portion of the "T" shaped groove. The conductive ring 150 begins at the nose 121 and extends circumferentially around the top of the collar housing 120 and terminates in a down-turned portion 151 at the nose 121. Likewise, the second ring 160 begins at the nose 121 and extends circumferentially around the top of the collar housing 120 and terminates in a down-turned portion 161 at the nose 121. The "T" shaped retainer ring 140 is a one piece unit that begins at the nose 121 and extends circumferentially around the collar housing 120 and terminates at a nose cover 141 which is bonded to the retainer ring 140.

Figure 4:
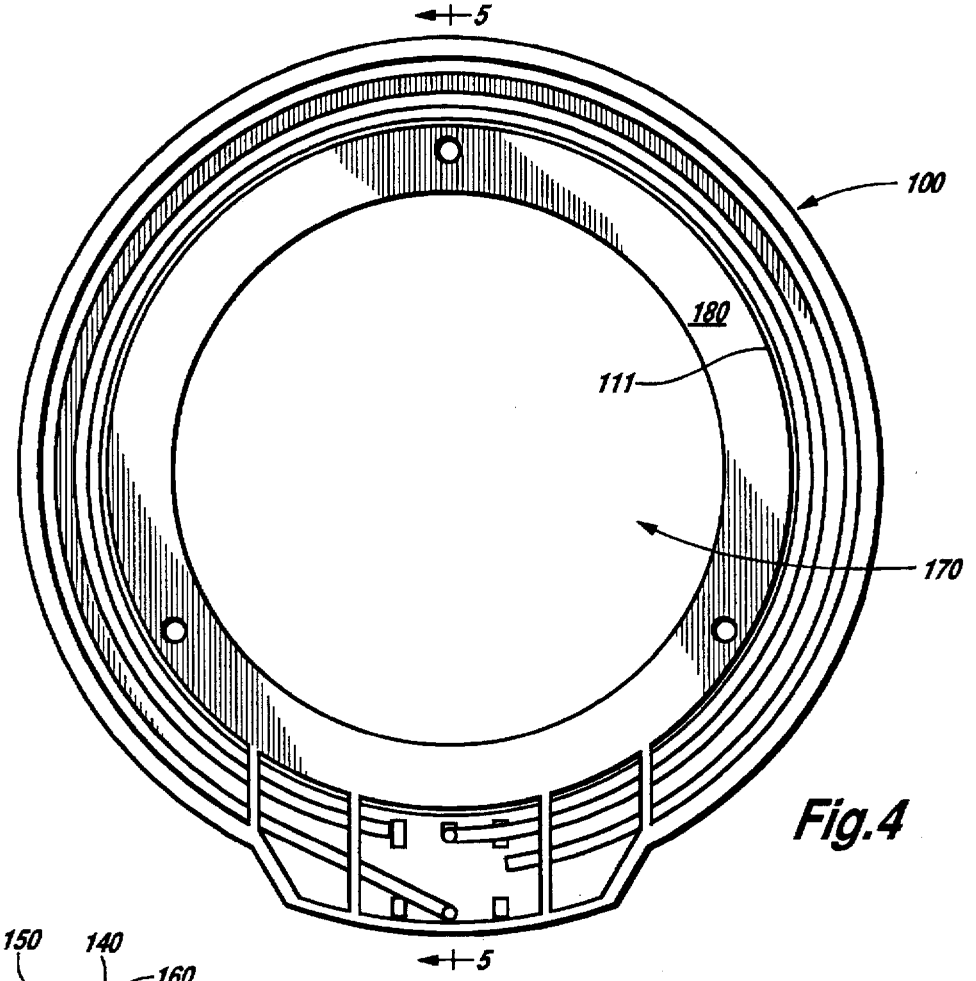
FIG. 4 is a top view of the inventory control collar without the insulating retainer ring and nose cover in position.

Referring to FIGS. 2, 4 and 5, the down-turned portions 161 and 151 penetrate the top of the nose 121 to connect with the data and ground contact points of the touch memory cannister 200 (not shown).

As can be seen in FIG. 2, the housing 120 includes a central opening 170 of sufficient diameter to pass the storage container threaded neck 1010 therethrough. Referring now to FIGS. 1–5, the housing 120 includes a bottom ledge 180 projecting inwardly into the opening 170. The inventory control collar locking ring 10 seats in the depression 110 and rests on the bottom ledge 180.

Figure 6:
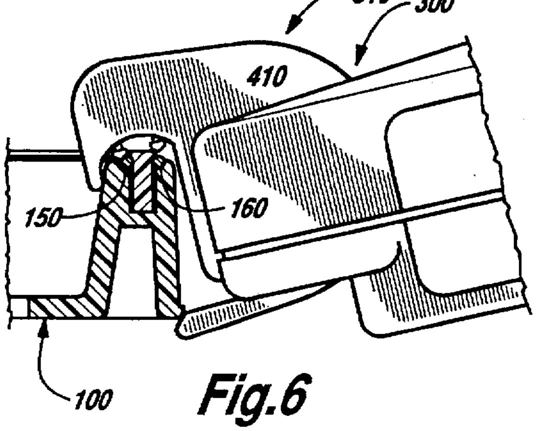
FIGS. 6 and 7 are partial views of a portion of an inventory control probe engaging the inventory control collar of the present invention.
Figure 7:
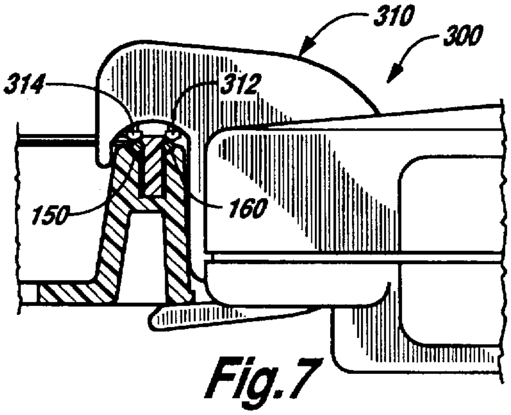
Figure 8:
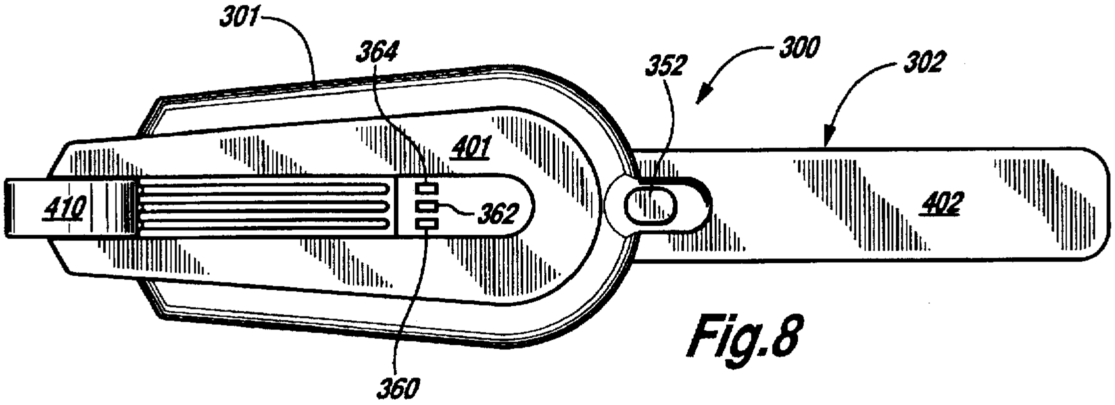
FIG. 8 is a top view of the inventory control probe.

Turning to FIGS. 6, 7 and 8, data is written and read from the touch memory cannister 200 of the inventory control collar 100 with an inventory control probe 300 by concurrently touching the probe tip 310, having contact pins 312 and 314 to the conductive rings 150 and 160 exposed on the upper surface of the inventory control collar 100. Data is transmitted by means of a metal-to-metal contact between the conductive rings 150 and 160, attached to the touch memory cannister 200, and the contact pins 312 and 314 of the inventory control probe.

Although preferred and alternative embodiments of the invention have been illustrated in the accompanying Drawings and described in the foregoing Detailed Description, it will be understood that the invention is not limited to the embodiments disclosed but are capable of numerous modifications without departing from the scope of the invention as claimed.

We claim:

1. An inventory control collar for use on a storage container, said storage container having a neck of predetermined size and shape, said inventory control collar comprising:

an electrically insulative housing having a top, bottom, and central opening sized to fit around the neck of said storage container, and a circumferential groove located in the top of the housing;

a memory supported in said housing;

a first conductive ring inserted into the circumferential groove in the housing and electrically connected to said memory;

a second conductive ring inserted into the circumferential groove in the housing and electrically connected to said memory; and an electrically insulative retaining ring inserted into the circumferential groove in the housing between the first and second rings.

2. The inventory control collar of claim 1 further including a subhousing for said memory, said subhousing attached to the exterior of the housing.

3. An inventory control collar for use on a storage container, said storage container having a cylindrical neck of predetermined size and shape, said inventory control collar comprising:

an electrically insulative housing having a top, bottom, and central opening sized to fit around the cylindrical neck of said storage container, and a circumferential groove located in the top of the housing;

a memory supported in said housing and having a first electrical contact, and a second electrical contact;

a first conductive ring inserted into the circumferential groove in the housing and electrically connected to the first contact of said memory;

a second conductive ring inserted into the circumferential groove in the housing and electrically connected to the second contact of said memory; and an electrically insulative retaining ring inserted into the circumferential groove in the housing between the first and second rings.

4. The inventory control collar of claim 3 further including a subhousing for said memory, said subhousing attached to the exterior of the housing.

5. An inventory control collar for use on a storage container, said storage container having a neck of predetermined size and shape, said inventory control collar comprising:

an electrically insulative housing having a truncated conal exterior shape including:

a top, bottom, a central opening sized to fit around the neck of said storage container, a ledge positioned within said central opening and attached circumferentially to said housing, and a circumferential groove located in the top of the housing;

a memory supported in a subhousing attached to the exterior of said housing;

a first conductive ring inserted into the circumferential groove in the housing and electrically connected to said memory;

a second conductive ring inserted into the circumferential groove in the housing and electrically connected to said memory; and an electrically insulative retaining ring inserted into the circumferential groove in the housing between the first and second rings; and a locking ring sized to be received in said ledge, said locking ring including a central opening sized to fit around the neck of the storage container.

* * * * *